United States Patent
Winslow

(10) Patent No.: US 6,194,968 B1
(45) Date of Patent: Feb. 27, 2001

(54) TEMPERATURE AND PROCESS COMPENSATING CIRCUIT AND CONTROLLER FOR AN RF POWER AMPLIFIER

(75) Inventor: Thomas Aaron Winslow, Salem, VA (US)

(73) Assignee: Tyco Electronics Logistics AG, Steinach/SG (CH)

(*) Notice: Subject to any disclaimer, the term of this patent is extended or adjusted under 35 U.S.C. 154(b) by 0 days.

(21) Appl. No.: 09/307,689

(22) Filed: May 10, 1999

(51) Int. Cl.[7] ........................................ H03F 3/04
(52) U.S. Cl. .................. 330/289; 330/285; 455/126
(58) Field of Search ............................ 330/285, 289, 330/310; 455/126, 115

(56) References Cited

U.S. PATENT DOCUMENTS

| 5,036,228 | * | 7/1991 | Noro ................................... 330/289 |
| 5,052,121 | | 10/1991 | Wachtler ................................. 33/813 |
| 5,132,632 | * | 7/1992 | Russell et al. ........................ 330/289 |
| 5,369,319 | | 11/1994 | Good et al. ............................. 327/73 |
| 5,724,004 | | 3/1998 | Reif et al. ............................. 330/277 |
| 5,774,017 | | 6/1998 | Adar ...................................... 330/51 |
| 5,790,943 | | 8/1998 | Fotowat-Ahmady et al. ..... 455/226.2 |
| 5,880,635 | | 3/1999 | Satoh .................................... 330/144 |
| 6,008,698 | * | 12/1999 | Dacus et al. ......................... 330/285 |

* cited by examiner

Primary Examiner—Robert Pascal
Assistant Examiner—Khanh Van Nguyen
(74) Attorney, Agent, or Firm—Arthur L. Plevy; Buchanan Ingersoll PC

(57) ABSTRACT

A radio frequency (RF) power amplifier circuit comprising an RF gain stage formed on an integrated circuit (IC) chip comprising at least one field effect transistor configured for amplifying an RF signal to provide an amplified RF signal to an antenna at a given RF power level; a compensation circuit formed on the IC chip for generating a first voltage $VS_+$ and a second voltage $VS_-$ at respective first and second output terminals, the voltage difference therebetween corresponding to a level of temperature or process fluctuation from a given level associated with the RF gain stage; and a control circuit comprising an operational amplifier coupled to the output terminals of the compensation circuit for receiving the first and second voltages $VS_+$, $VS_-$ and outputting a control signal to the gate of the at least one FET of the RF gain stage to compensate the RF gain stage for the fluctuation, whereby a substantially constant power output to the antenna is maintained.

27 Claims, 3 Drawing Sheets

TEMPERATURE AND PROCESS COMPENSATING CIRCUIT AND CONTROLLER FOR AN RF POWER AMPLIFIER

FIELD OF THE INVENTION

This invention relates generally to communication devices, and more particularly, to a power amplifier circuit for a radio frequency communication device.

BACKGROUND OF THE INVENTION

Power amplifier circuits are used for amplifying radio frequency (RF) signals for transmission by a communication device. In operation, a power amplifier circuit receives an RF signal in the transmit path of the communication device, amplifies the RF signal, and provides the amplified signal to an antenna. To meet system requirements, the RF antenna power output must be maintained substantially constant. For example, existing standards for mobile cellular telephones specify 600 mW RF power output at the antenna.

Gallium arsenide (GaAs) MESFET (metal epitaxial semiconductor field effect transistor) devices are typically used in the amplification stage of power amplifier design. Such devices provide good performance across a wide frequency range, including the range from 1800 to 2000 MHZ. MESFET devices operated in depletion mode typically require a gate to source voltage ($V_{gs}$) less than zero volts to turn off the transistors. A bias voltage is supplied to the MESFET to establish the $V_{gs}$.

The threshold or pinch off voltage ($V_{th}$) of a depletion mode MESFET has a negative temperature coefficient. That is, the threshold voltage becomes more negative with increasing temperature. When such a device is operating near pinch off, an increasingly more negative gate voltage will maintain a constant drain current as temperature increases. Constant drain current with respect to temperature results in lower RF gain of the amplification stage and lower power output, with increasing temperature. This is due to the MESFET transconductance, which has a negative temperature coefficient, and output conductance, which has a positive temperature coefficient. As a result, RF GaAs MESFET devices require a bias current which increases with increasing temperature to maintain constant gain and output power.

Conventional communications devices have used a closed loop feedback system for maintaining constant output power. In such a system, output power is detected at the antenna and a signal indicative of the output power is conveyed to a control circuit, such as a microprocessor, in the communication device. The controller than adjusts the bias current as required to maintain constant output power. Such conventional designs, however, significantly limit the performance of the power amplifier. For instance, a directional coupler is required for detecting output power at the antenna. The directional coupler causes excess power loss at the antenna. At maximum transmit power, the power loss could be as high as 1 dB or 25 percent. In addition, the circuit elements employed for detecting output power and adjusting bias current are not able to develop the negative (below 2 volts) gate to source voltage for biasing the depletion mode MESFET.

U.S. Pat. No. 5,724,004 entitled *VOLTAGE BIAS AND TEMPERATURE COMPENSATION CIRCUIT FOR RADIO FREQUENCY POWER AMPLIFIER* issued to Reif et al. on Mar. 3, 1998 attempts to overcome the aforementioned problems and discloses a power amplifier and bias circuit where the power amplifier includes a depletion mode MESFET for power amplification. The MESFET is biased via the bias circuit which includes a level shifter for providing the necessary gate to source voltage to the MESFET. The bias circuit output voltage varies over temperature to track the temperature variation of the MESFET in order to maintain a substantially constant RF output power.

Other implementations of temperature compensation circuits for power amplifiers typically utilize a gallium arsenide based differential input amplifier followed by a voltage level shifting buffer biased via current sources. However, current biasing causes the differential amplifier and level shifting circuitry to be less sensitive to bias voltage and temperature fluctuations. Therefore, temperature compensating control circuits currently in existence have a limited voltage control range, while temperature compensation occurs over a similarly limited temperature range. That is, current control circuits are operable to adjust only a certain amount of compensation to the power amplifier over a temperature range before requiring a complete termination of shut off or the power amplifier. Accordingly, a device that is both temperature and process sensitive and which performs level shifting and temperature compensation over a greater range of values is highly desired.

SUMMARY OF THE INVENTION

A radio frequency (RF) power amplifier circuit comprising an RF gain stage formed on an integrated circuit (IC) chip comprising at least one field effect transistor configured for amplifying an RF signal to provide an amplified RF signal to an antenna at a given RF power level; a compensation circuit formed on the IC chip for generating a first voltage $VS_+$ and a second voltage $VS_-$ at respective first and second output terminals, the voltage difference therebetween corresponding to a level of temperature or process fluctuation from a given level associated with the RF gain stage; and a control circuit comprising an operational amplifier coupled to the output terminals of the compensation circuit for receiving the first and second voltages $VS_+$, $VS_-$ and outputting a control signal to the gate of the at least one FET of the RF gain stage to compensate the RF gain stage for the fluctuation, whereby a substantially constant power output to the antenna is maintained.

There is also disclosed an RF power amplifier circuit comprising a plurality of MESFET amplifiers coupled together in a cascaded configuration for amplifying an RF signal to provide an amplified RF signal at an output terminal and at a given power; a sensing circuit comprising a MESFET amplifier having temperature characteristics similar to those of the plurality of MESFET amplifiers, the sensing circuit positioned adjacent the plurality such that the sensing circuit is affected by temperature fluctuations in the plurality of MESFETs, the sensing circuit having first and second output terminals for outputting first and second voltage signals respectively which correspond to a differential voltage indicative of the sensed difference in temperature from a given level of the plurality of MESFETs; and a control circuit comprising an operational amplifier for receiving the first and second differential voltage signals and responsive to a variable input control voltage for providing an output control signal to at least one gate electrode of the plurality of MESFETs to cause a change in output characteristics of the plurality to compensate for the sensed temperature fluctuation.

DETAILED DESCRIPTION OF THE INVENTION

Figure 1:
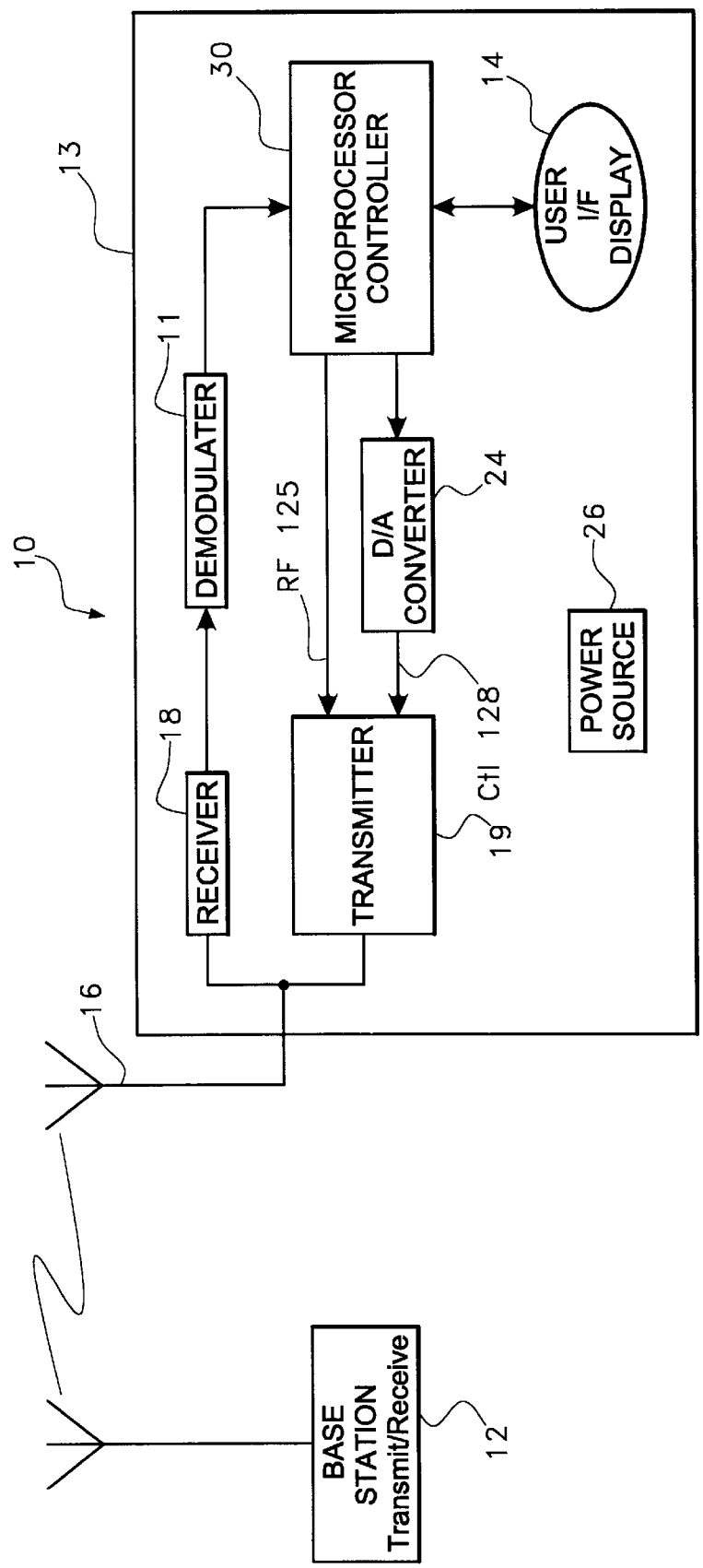
FIG. 1 is a block diagram of a communication system in which the present invention is incorporated.

Referring now to FIG. 1, there is shown in block diagram form a telecommunication system 10 in which the present invention is incorporated. The communication system 10 comprises a remote base station transceiver 12 for transmitting and receiving RF signals to/from a communication device 13 such as a mobile cellular telephone. Cellular telephone 13 includes an antenna 16 for transmitting and receiving signals to and from base station 12, receiver circuit 18, transmitter circuit 19, demodulator 11, and controller 30 which includes a microprocessor. The user interface 14 coupled to the controller 30 operates to communicate received information or voice information to and from the user. As is well known, the user interface typically includes a display unit, keypad, and microphone and speaker system. Power source 26 such as a conventional battery operates to provide electrical power to the cell phone 13. The operation of the communication system is as follows.

In a receive mode, the cell phone 13 receives RF signals via antenna 16 and receiver 18 and converts the received signals into base band signals. Demodulator 11 coupled to receiver 18 demodulates the base band signals and recovers the data transmitted on the RF signals and provides the data to controller 30. The controller operates to format the data into recognizable voice or information for communication to the user interface module. In transmit mode, the user interface 14 operates to transmit user input data to the controller which processes and formats the information for input to the transmitter circuit 19 for conversion into RF modulated signals. The transmitter circuit then sends modulated signals to antenna 16 for transmission to base station 12.

The microprocessor controller further includes the digital to analog converter 24. As illustrated, the controller outputs a base band signal RF 125 for input to the transmitter, as well as a control signal 128 ($V_{CTL}$) of a given voltage for producing a transmitted signal to the antenna at a given power level.

Figure 2:
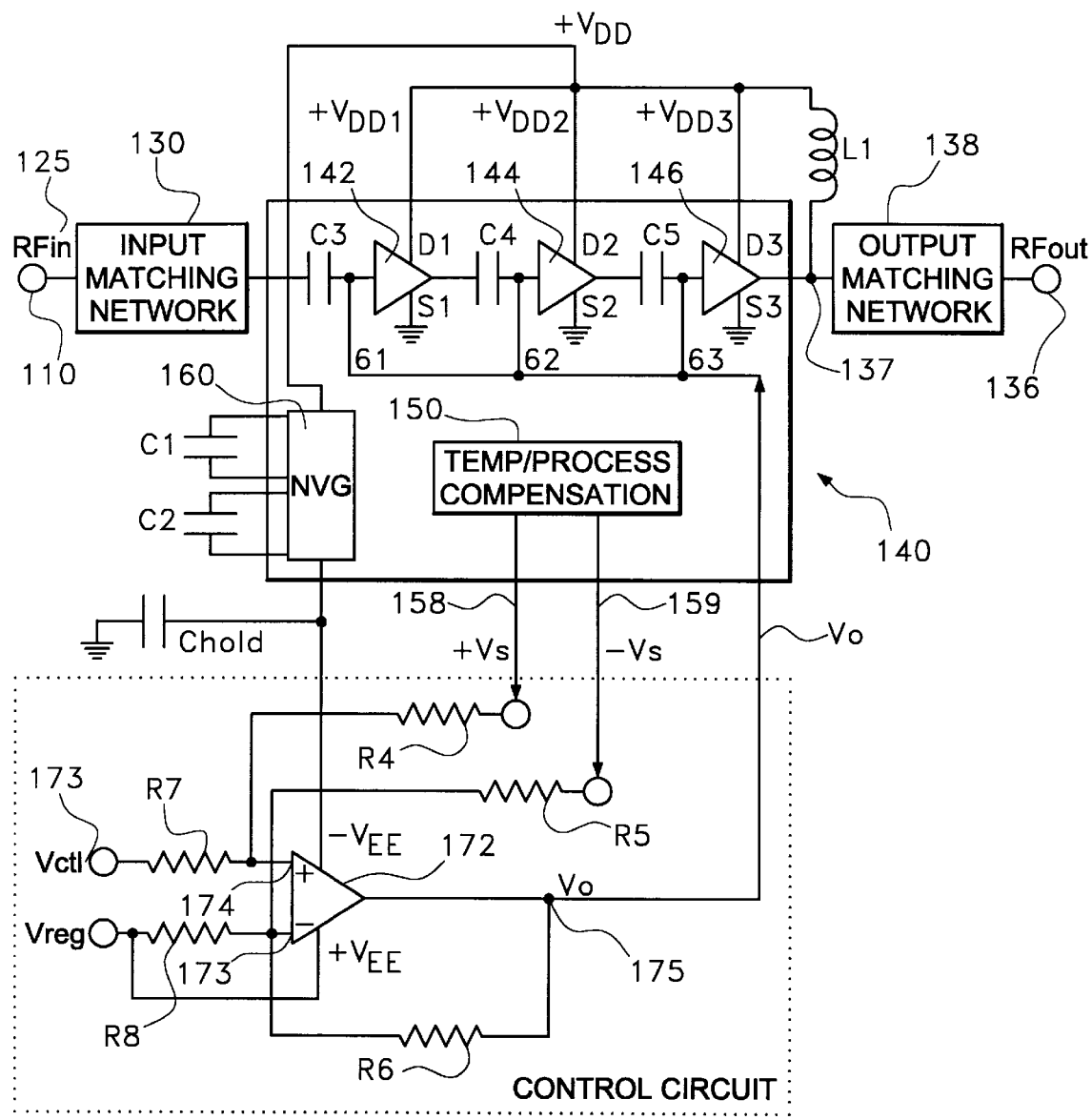
FIG. 2 is a block diagram of the power amplifying apparatus according to the present invention for use in the communication system of FIG. 1.

FIG. 2 illustrates operation of the transmitter circuit according to the present invention. Referring now to FIG. 2, there is shown a block diagram of the transmitter circuit amplifying apparatus. The transmitter includes an RF gain stage amplifying circuitry 140, a temperature and process compensating circuit 150, and a control circuit 170. The amplifying circuitry 140 includes an input matching circuit 130 for receiving and providing impedance matching of the RF input signal 125 ($RF_{in}$) and power amplifier devices 142, 144, and 146 comprising depletion mode MESFETs (metal epitaxial semiconductor field effect transistors). Each of the MESFETs is coupled in cascaded fashion to one another via corresponding capacitors C4 and C5, while capacitor C3 capacitively couples MESFET 142 with the input matching network 130. The MESFETs are configured for amplifying an RF signal $RF_{in}$ received at input terminal 110 for producing an amplified RF signal $RF_{out}$ at output terminal 136. An output matching network 138 is coupled at mode 137 between the output of the last stage MESFET 146 and the output terminal 136 for providing impedance matching. Inductor LI coupled between the supply voltage and node 137 acts as an RF choke. The output 136 of the RF power amplifying stage is coupled to the antenna 16 (see FIG. 1) for providing RF signals to the antenna at a given RF antenna power output level based on the input control voltage 128 ($V_{CTL}$). Each of the depletion mode MESFET amplifiers 142, 144, and 146 have a drain electrode (D1, D2,D3) coupled to a positive power supply source Vdd and a source electrode (S1,S2,S3) coupled to a reference potential which is typically ground or zero volts.

As shown in FIG. 2, each of the gate electrodes G1, G2, and G3 corresponding to the respective depletion mode MESFETs 142, 144, and 146 are coupled to the output of control circuit 170. Note that each of the MESFETs 142, 144 and 146 require biasing by a negative gate to source voltage. These MESFETs are operated by biasing with the gate to source voltage ($V_{gs}$) approximating a pinch off or threshold voltage ($V_{th}$) of the MESFET. Typically, the threshold or pinch off voltage of the depletion mode MESFETs have a nominal value of approximately −1.2 volts at room temperature so that in order to turn off the MESFETs, a gate to source voltage more negative than −1.2 volts must be applied.

As is well known in the art, the MESFETs are characterized by a temperature coefficient and are thus susceptible to temperature and process parameter variations. Such process parameters include sheet resistance and via resistance. Temperature and process parameter fluctuations result in a variation in threshold voltage which in turn results in a loss of gain as the MESFETs increase in temperature. This in turn results in an unstable output power level applied to the antenna. Since a one to one correspondence between the output power of the amplifier of the apparatus and a control voltage Vctl (reference numeral 128) is desired (i.e. a power output constant for a fixed input control signal), those temperature and process fluctuations occurring in the amplifying apparatus may cause undesirable power fluctuations for a given control voltage. The temperature and process compensation circuit and controller circuitry operate to compensate the amplifier for these fluctuations, as will be described herein below.

Figure 3:
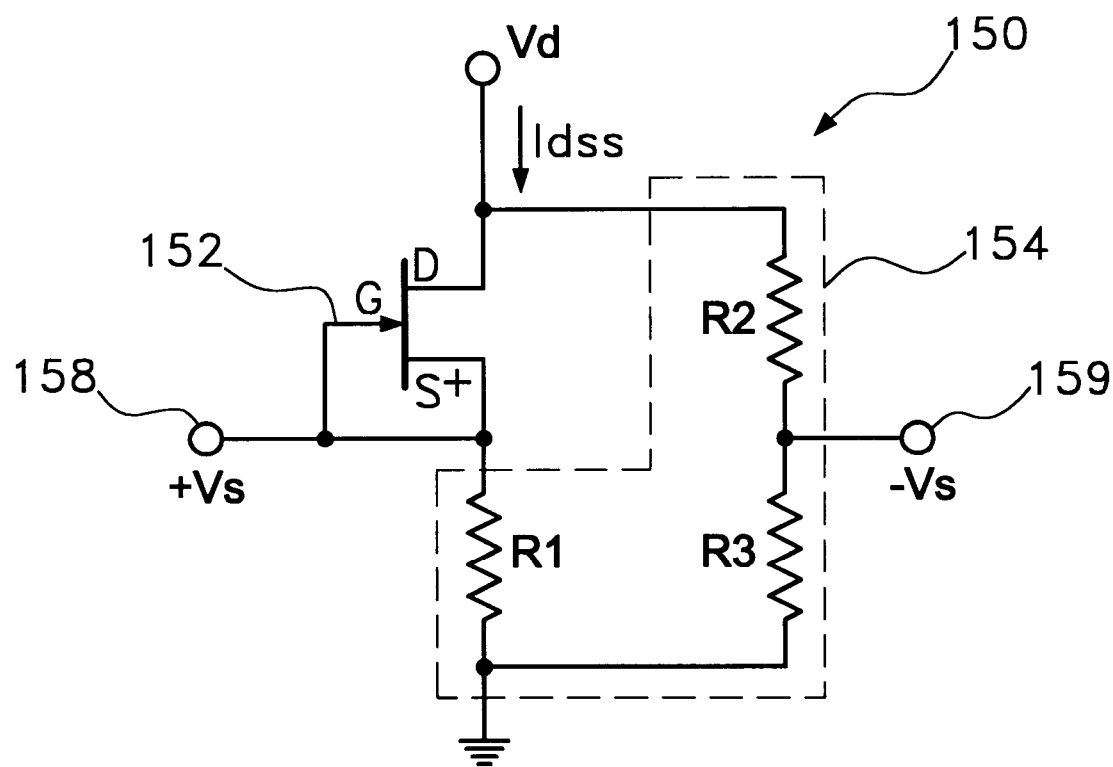
FIG. 3 is a schematic diagram of the temperature and process compensation circuit as shown in FIG. 2.

The temperature and process compensation circuit 150 operates to generate a differential signal voltage ($VS_+ - VS_-$) indicative of a fluctuation in temperature and/or process associated with the RF gain stage amplifiers. Circuit 150 in conjunction with control circuit 170 operates to simultaneously sense and then correct for both temperature and process variations. Temperature and process compensation circuit 150 comprises a gallium arsenide MESFET and a resistor network as shown in FIG. 3. Circuit 150 is both temperature and process sensitive and located physically adjacent or next to (and in very close proximity to) the operating RFIC power amplifier 140. Power amplifier 140 requires compensation to correct performance drift with temperature and process. The temperature and process compensating circuit 150 is located on the same MMIC as the power amplifier 140.

Referring now to FIG. 3, there is shown the gallium arsenide based differential temperature and process sensing in compensation circuit 150 which comprises a depletion mode MESFET 152 which has temperature and process characteristics similar (preferably identical) to those of the MESFET power amplifiers 142, 144, and 146 such that the temperature fluctuations associated with the amplifier MESFETs also affect the sensing circuit MESFET 152. MESFET 152 has a drain electrode D coupled to a battery or regulated supply voltage $V_d$ and gate G and source S electrodes coupled to a common node. Resistor R1 has a first terminal end coupled to source S and a second terminal end connected to ground or reference potential. The drain electrode D is coupled to a first terminal end of resistor R2. Resistor R2 is coupled at a second terminal end to resistor R3 which is also connected to ground potential so that the resistors R1, R2, and R3 form a voltage divider network 154. The gallium arsenide based differential temperature sensing circuit is affected by the temperature rise (or fall) of the power amplifier 140 and by the drift and peak current due to process fluctuations. Preferably, resistors R1 and R3 have equal value and the periphery of the MESFET 152 in a current source configuration (operating at $I_{dss}$) is sized to create an identical voltage across R1 and R3 at room temperature. As shown in FIG. 3, the differential output $VS_+$ represents the voltage drop across resistor R1 while the voltage $VS_-$ represents the voltage drop across R3. Accordingly, the circuit may be calibrated such that, at room temperature, the differential voltage is zero ($VS_+ - VS_- = 0$ volts). As the temperature drifts from ambient level to a positive or negative value, a differential voltage is generated across $VS_+$ and $VS_-$. This differential voltage is output from the temperature and process compensating circuit at respective output terminals 158 and 159 and input to the control circuit 170.

Control circuit 170 comprises an operational amplifier 172 having differential inputs comprising inverting input terminal 173 and non inverting input terminal 174 for receiving each of the respective differential voltages $VS_-$ and $VS_+$. Variable control voltage $V_{CTL}$ (reference numeral 128) from the DAC is also input to non-inverting input terminal 174 of operational amplifier 172, while regulating voltage $V_{REG}$ is input at inverting terminal 173. A resistive network coupled to the operational amplifier 172 comprising resistors R4, R5, R6, R7 and R8 provide a mechanism for adjusting the gain of the operational amplifier to control the output control voltage signal $V_o$ at output terminal 175 for compensating the RF gain stage of the power amplifier. As shown in FIG. 2, the control circuit comprising the operational amplifier is configured in a level shifting follower configuration utilizing the operating equations below. For example:

$$\text{Let } \frac{1}{R_7} \equiv \frac{1}{R_8} + \frac{1}{R_6}$$

And let $R_6 = R_8$, $R_4 = R_5$ $$\text{Therefore: } V_0 = 2 \cdot V_i - V_{REG} + \frac{R_6}{R_8}(V_S^+ - V_S^-)$$

V0=output negative voltage supplied to power amplifier MESFET Gate
Vi=input control voltage from DAC 0–2.7 V range ($V_{CTL}$)
$V_{REG}$=stable reference voltage=2.7V ($V_{REG}$)
$R_6/R_8$=Process/Temperature Gain control controlled by the ratio of these resistor values.
($Vs^+ - Vs^-$)=differential voltage from the temperature compensation circuit Typical values R6 and R8 are 20KΩ. The value of resistors R4 and R5 are user defined depending on the amount of gain, but are typically 10–15 kΩ. An associated gain value is approximately 2.

Thus, by appropriately sizing the resistor values in the controller circuit, the amount of polarity of temperature compensation can be user designed. An increasing or decreasing differential sense voltage ($VS_+$, $VS_-$) operates to correct the output control voltage Vo of the operational amplifier which feeds the gate voltage of the power amplifier arrangement 140.

The temperature and process compensation circuit operates to detect temperature and process parameter fluctuations over a range of temperatures from +80 to −40 degrees C (Celsius). Furthermore, compensation is not limited by the control circuitry 170, as the operational amplifier coupled to the process and temperature sensitive circuit with differential outputs has much greater ideal properties than devices used in other control circuits. Such properties include a high common mode rejection ratio so as to minimize $VS_+$ and $VS_-$ fluctuations, a high power supply rejection ratio, and a greater inherent temperature stability. The operational amplifier 172 includes a supply terminal for receiving a negative voltage VEE from a negative voltage generator 160. This permits the operational amplifier to swing to a negative voltage sufficient to switch off the cascaded MESFET amplifiers. By providing a high power supply rejection ratio, the gallium arsenide based generator, whose negative output voltage can drift with temperature, the operational amplifier is relatively immune to such fluctuations so as to not influence the output control voltage $V_0$ input to the gate of the MESFETs. This results in greater power stability and reduces the influence on the output power level of non amplifying, temperature dependent devices. Note also that as the control circuit is user definable, compensation may occur through either positive compensation or negative compensation by interchanging the output signals $VS_+$ and $VS_-$ with the respective input terminals 173 and 174 of the operational amplifier.

As can be seen from the foregoing, by temperature and process compensating the output voltage $V_{out}$ at the output of the control circuit for feedback into the gates of each of the MESFET amplifiers. Temperature and process variations of the MESFETs may be tracked via circuit 150 and controlled via circuit 170 to maintain the RF antenna power output level at a substantially constant value over temperature and process.

It is to be understood that one skilled in the art may make many variations and modifications to that described herein. All such variations and modifications are intended to be included within the scope of the invention as defined in the appended claims.

What is claimed is:

1. An amplifying apparatus comprising:
   an RF gain stage for providing an amplified RF signal at an output terminal thereof;
   means for generating a differential signal indicative of a fluctuation in temperature or process of said RF gain stage from an ambient value; and
   a control circuit comprising an operational amplifier responsive to said differential signal and to a variable input control signal for providing a control signal to said RF gain stage to compensate said RF gain stage for said temperature or process fluctuation to maintain a substantially constant power output at said output terminal.

2. The apparatus according to claim 1, wherein said control circuit further comprises a resistive network coupled to said operational amplifier for affecting the gain of said operational amplifier to control the magnitude of said control signal.

3. The apparatus according to claim 1, wherein said differential signal comprises a first voltage signal $VS_+$ and a second voltage signal $VS_-$, and wherein said operational amplifier includes a first input terminal for receiving said $VS_+$ signal and a second input terminal for receiving said $VS_-$ signal.

4. The apparatus according to claim 2, wherein said means for generating said differential signal includes a FET based sensor circuit and wherein said differential signal comprises a first voltage signal $VS_+$ output at a first terminal thereof, and a second voltage signal $VS_-$ output at a second terminal of said sensor circuit.

5. The apparatus according to claim 4, wherein said resistive network includes a first resistor coupled between said first output terminal of said sensor circuit and a first input terminal of said operational amplifier, a second resistor coupled between said second output terminal of said sensor circuit and a second input terminal of said operational amplifier and a third resistor coupled between said second input terminal of said operational amplifier and an output terminal of said operational amplifier.

6. The apparatus according to claim 4, wherein said sensor circuit further comprises a voltage divider network coupled to said FET for generating said $VS_+$ and $VS_-$ voltage signals.

7. The apparatus according to claim 6, wherein said voltage divider network comprises:
   a first resistor coupled between a source electrode of said FET and a reference potential, said FET having a gate electrode coupled to said source electrode, and a drain electrode coupled to a supply voltage,
   a second resistor having a first terminal coupled to said drain electrode and a second terminal coupled to a first terminal of a third resistor,
   said third resistor having a second terminal coupled to said reference potential,
   wherein the voltage across said first resistor corresponds to said $VS_+$ signal, and
   wherein the voltage drop across said third resistor corresponds to said $VS_-$ signal.

8. The apparatus according to claim 7, wherein said first and third resistors are of equal resistance values.

9. The apparatus according to claim 1, wherein said RF gain stage includes a plurality of cascaded MESFETs for amplifying said RF signal, and wherein said means for generating a differential signal includes a MESFET coupled to a voltage divider network for generating said differential signal.

10. A radio frequency (RF) power amplifier circuit comprising:
    an RF gain stage formed on an integrated circuit (IC) chip comprising at least one field effect transistor configured for amplifying an RF signal to provide an amplified RF signal to an antenna at a given RF power level;
    a compensation circuit formed on said IC chip for generating a first voltage $VS_+$ and a second voltage $VS_-$ at respective first and second output terminals thereof, the voltage difference therebetween corresponding to a level of temperature or process fluctuation associated with said RF gain stage from a given level; and
    a control circuit comprising an operational amplifier coupled to the first and second output terminals of said compensation circuit for receiving said first and second voltages $VS_+$, $VS_-$ and outputting a control signal to the gate of said at least one FET of said RF gain stage to compensate said RF gain stage for said fluctuation, whereby a substantially constant power output to said antenna is maintained.

11. The power amplifier circuit according to claim 10, wherein said compensation circuit is positioned on said IC chip in close proximity to said RF gain stage.

12. The power amplifier circuit according to claim 10, wherein said compensation circuit comprises a MESFET having a drain electrode coupled to a power supply and a gate and source electrode coupled to one another.

13. The amplifier circuit according to claim 12, wherein said compensation circuit further includes a voltage divider network comprising a first resistor coupled between said gate electrode and ground potential for generating said first voltage $VS_+$ and a second resistor coupled to said FET drain electrode at a first terminal and to a third resistor at a second terminal, wherein the voltage across said third resistor corresponds to said second voltage $VS_-$.

14. The power amplifier circuit according to claim 10, wherein said control circuit operational amplifier has a supply voltage input coupled to a negative voltage generator for supplying said operational amplifier with a negative voltage.

15. The amplifier circuit according to claim 13, wherein said first and third resistors of said compensation circuit have equal value and wherein said MESFET and voltage divider network is configured such that said $VS_+$ and said $VS_-$ voltages are equal at a given temperature corresponding to the ambient level.

16. An RF power amplifier circuit comprising:
    a plurality of FET amplifiers coupled together in a cascaded configuration for amplifying an RF signal to provide an amplified RF signal at an output terminal and at a given power;
    a sensing circuit comprising a FET amplifier having temperature characteristics similar to those of said plurality of FET amplifiers, said sensing circuit positioned adjacent said plurality such that said sensing circuit is affected by temperature fluctuations in said plurality of FET amplifiers, said sensing circuit having first and second output terminals for outputting first and second voltage signals respectively which correspond to a differential voltage indicative of the sensed difference in temperature from a given level of said plurality of FET amplifiers; and
    a control circuit comprising an operational amplifier for receiving said first and second differential voltage signals and responsive to a variable input control voltage for providing an output control signal to at least one gate electrode of said plurality of FETs to cause a change in output characteristics of said plurality to compensate for said sensed temperature fluctuation.

17. The apparatus according to claim 16, wherein said plurality of FET amplifiers comprises MESFETs and wherein said sensing circuit FET amplifier comprises a MESFET.

18. The power amplifier circuit according to claim 16, wherein said control circuit comprises an operational amplifier having a first input coupled to said first differential voltage signal, and a second input coupled to said second differential voltage signal and to said variable input control voltage.

19. The apparatus according to claim 16, wherein said operational amplifier has an input supply terminal coupled to a negative voltage generator source for providing a negative voltage sufficient to turn off said plurality of FET amplifiers.

20. A power amplifier circuit comprising:
    an RF gain stage formed on an integrated circuit (IC) for providing an amplified RF signal at an output terminal thereof;
    a compensation circuit formed on said IC chip for generating a first voltage and a second voltage at respective first and second output terminals thereof, the voltage difference therebetween corresponding to a level of fluctuation associated with said RF gain stage from a given level; and a control circuit comprising an operational amplifier coupled to the first and second output terminals of said compensation circuit for receiving said first and second voltages and outputting a control signal to said RF gain stage to compensate said RF gain stage for said fluctuation.

21. A compensation circuit for use in a power amplifier comprising:

a sensor circuit including a transistor for producing a first voltage signal and a second voltage signal at output terminals thereof, said first and second voltage signals corresponding to a differential voltage therebetween indicative of a fluctuation in temperature in an amplification stage of said power amplifier; and a control circuit comprising an operational amplifier responsive to said first and second voltage signals and to an at least one input control signal for providing a control signal to said amplification stage to compensate said amplification stage for said temperature fluctuation.

22. The compensation circuit according to claim 21, wherein said transistor comprises a MESFET having temperature characteristics similar to said amplification stage of said power amplifier.

23. An amplifying apparatus comprising:

an RF gain stage for providing an amplified RF signal at an output terminal thereof;

a sensor circuit for generating a differential voltage signal indicative of a fluctuation in temperature of said RF gain stage from an ambient value; and a control circuit comprising an operational amplifier responsive to said differential voltage signal and to an at least one input control signal for providing a control signal to said RF gain stage to compensate said RF gain stage for said temperature fluctuation to maintain a substantially constant power output at said output terminal.

24. The apparatus according to claim 23, wherein said differential voltage signal comprises a first voltage signal output from a first terminal of said sensor circuit for input to an inverting input of said operational amplifier, and a second voltage signal output from a second terminal of said sensor circuit for input to a non-inverting input of said operational amplifier.

25. The apparatus according to claim 23, wherein said RF gain stage includes a plurality of FET-based devices.

26. The apparatus according to claim 25, wherein said plurality of FET-based devices include depletion mode GaAs MESFETs.

27. The apparatus according to claim 25, wherein said sensor circuit includes a FET-based device having temperature characteristics similar to said plurality of FET-based devices in said RF gain stage.

* * * * *